(12) United States Patent
Peng et al.

(10) Patent No.: US 9,157,933 B2
(45) Date of Patent: Oct. 13, 2015

(54) TEST DEVICE FOR WIRELESS ELECTRONIC DEVICES

(71) Applicant: Wistron NeWeb Corp., Hsinchu (TW)

(72) Inventors: Huang-Tse Peng, Hsinchu (TW);
Chin-Lien Huang, Hsinchu (TW);
Kuang-Yuan Ku, Hsinchu (TW)

(73) Assignee: Wistron NeWeb Corporation, Hsinchu (TW)

( * ) Notice: Subject to any disclaimer, the term of this patent is extended or adjusted under 35 U.S.C. 154(b) by 313 days.

(21) Appl. No.: 13/735,622

(22) Filed: Jan. 7, 2013

(65) Prior Publication Data

US 2013/0176047 A1  Jul. 11, 2013

(30) Foreign Application Priority Data

Jan. 9, 2012  (TW) .............................. 101100871 A

(51) Int. Cl.
| G01R 31/00 | (2006.01) |
| G01R 1/18 | (2006.01) |
| G01R 29/08 | (2006.01) |
| H01Q 13/08 | (2006.01) |
| H04M 1/24 | (2006.01) |

(52) U.S. Cl.
CPC .............. *G01R 1/18* (2013.01); *G01R 29/0821* (2013.01); *H01Q 13/085* (2013.01); *H04M 1/24* (2013.01)

(58) Field of Classification Search
CPC .. G01R 29/10; G01R 31/2831; G01S 7/2927; H01R 13/6205
USPC .................. 324/500, 750.22–750.26, 754.08, 324/754.19, 754.21, 754.31
See application file for complete search history.

(56) References Cited

U.S. PATENT DOCUMENTS

| 5,185,568 | A | * | 2/1993 | Mothersbaugh et al. ........ 324/95 |
| 6,023,203 | A | * | 2/2000 | Parish ............................ 333/126 |
| 6,215,448 | B1 | * | 4/2001 | DaSilva et al. ................ 343/703 |
| 6,657,577 | B1 | * | 12/2003 | Gregersen et al. .............. 342/22 |
| 6,946,950 | B1 | * | 9/2005 | Ueno et al. .................... 340/10.1 |
| 2007/0069756 | A1 | * | 3/2007 | Ambler et al. ................. 324/765 |
| 2008/0166007 | A1 | * | 7/2008 | Hankey et al. ................. 381/380 |
| 2009/0274072 | A1 | * | 11/2009 | Knox ............................. 370/278 |
| 2012/0112953 | A1 | * | 5/2012 | Grau Besoli et al. ......... 342/146 |
| 2013/0343697 | A1 | * | 12/2013 | Ishibashi ......................... 385/14 |
| 2014/0088434 | A1 | * | 3/2014 | Roth .............................. 600/473 |

* cited by examiner

*Primary Examiner* — Melissa Koval
*Assistant Examiner* — Trung Nguyen
(74) *Attorney, Agent, or Firm* — Muncy, Geissler, Olds & Lowe, P.C.

(57) ABSTRACT

A test device for wireless electronic devices includes a metal casing, a RF-absorbing material, a measurement antenna, and an impedance adjustment module. The impedance adjustment module includes a dielectric layer, a microstrip line, and a slot line, wherein the slot line is electrically connected to the measurement antenna. The microstrip line and the slot line are disposed on two opposite sides of the dielectric layer and respectively include a first body and a second body, which are parallel to each other.

13 Claims, 13 Drawing Sheets

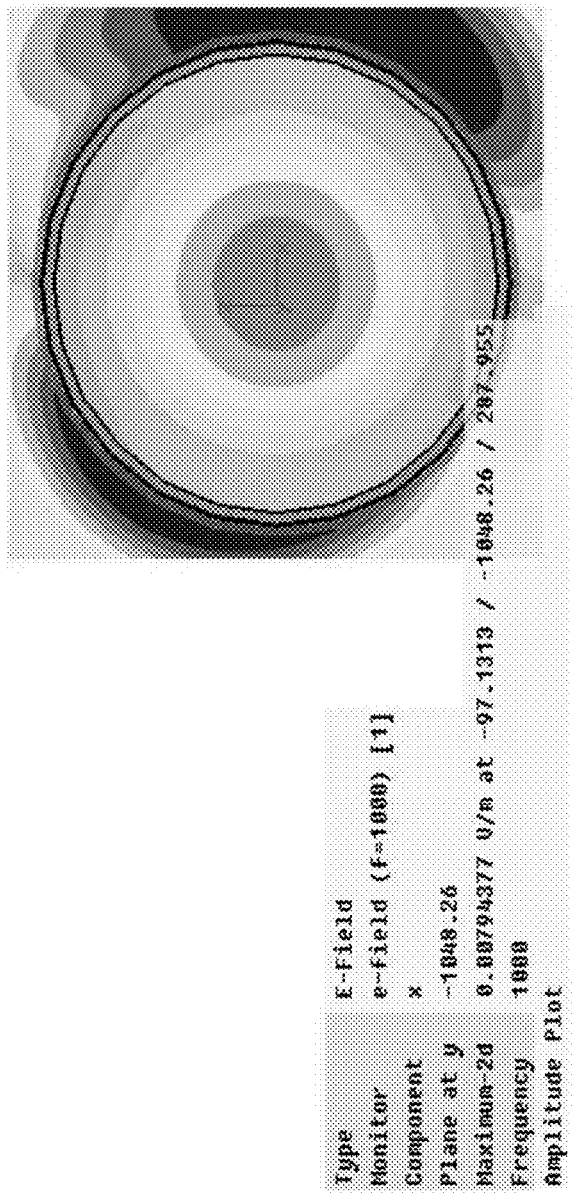
FIG. 5A Co-Polarized E-Field

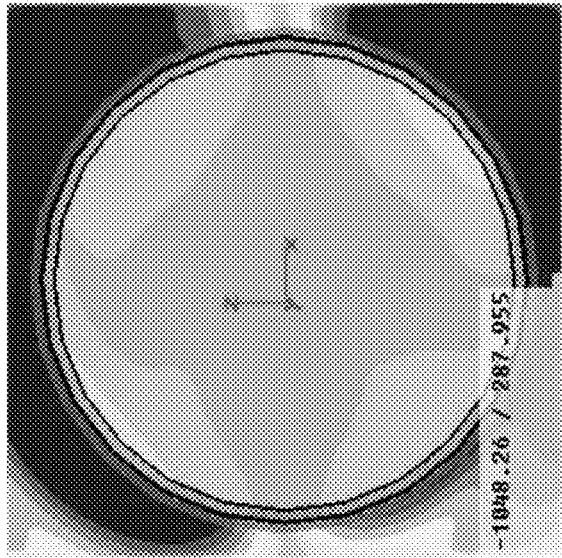
FIG. 5D Cross-Polarized H-Field

| -15.4 | -12.7 | -15.5 |
|---|---|---|
| -16 | -15.1dB | -16.3 |
| -15.8 | -15.2 | -15.7 |

| -26.3 | -24.7 | -27.8 |
|---|---|---|
| -25.2 | -25 | -27.5 |
| -24.1 | -24.2 | -26.0 |

| -31.2 | -30.0 | -32 |
|---|---|---|
| -28.3 | -30.7 | -28.4 |
| -28.4 | -27.3 | -28.5 |

FIG. 7B      FIG. 7C      FIG. 7D

TEST DEVICE FOR WIRELESS ELECTRONIC DEVICES

BACKGROUND OF THE INVENTION

1. Field of the Invention

The present invention relates to a test device for electronic devices. Particularly, the present invention relates to a test device for wireless electronic devices.

2. Description of the Prior Art

In the design process of wireless electronic devices, it requires continuously measuring the receiving and transmission status of wireless signals of wireless electronic devices for adjustment and design of wireless electronic devices in the future. In addition, wireless electronic devices still need to be continuously tested before shipping out to ensure the performance of wireless electronic devices satisfying requirements of manufacturers and regulations of authorities.

In order to isolate a wireless electronic device from ambient wireless signal, when the wireless electronic device is tested, the wireless electronic device is usually disposed in the shielding box with metal casing. FIG. 1 illustrates a schematic view of the inner part of a traditional shielding box 10. The traditional shielding box 10 includes a metal casing 11, a wave-absorbing material 20, and a first measurement antenna 30, wherein a feed-in portion 12 is disposed at one end of the first measurement antenna 30, so that the first measurement antenna 30 can receive signals through the feed-in portion 12 and produce electromagnetic field in the shielding box 10.

As shown in FIG. 1, the wave-absorbing material 20 is disposed on an inner surface of the metal casing 11 for absorbing the wireless signal transmitted from a wireless electronic device under test 50 to the metal casing 11. As such, the wave-absorbing material 20 may prevent a plurality of wireless signals from forming a composite wireless signal with a larger power through reflections and refractions to affect the test results. In addition, the metal casing 11 is connected to the ground 60 to avoid the formation of induction loop and guides the ambient wireless signal to the ground 60.

Besides, the first measurement antenna 30 shown in FIG. 1 is substantially a cone extending from one end of the metal casing 11 to the other end thereof. The wireless electronic device 50 is disposed in the metal casing 11 on a plane adjacent to the first measurement antenna 30 for testing. In other words, the first measurement antenna 30 laterally forms an electromagnetic field to cover and test the wireless electronic device 50. However, because the cone has an irregular shape, the first measurement antenna 30 will produce an electromagnetic field having irregular magnitude in the traditional shielding box 10. As such, when the position of the wireless electronic device 50 in the shielding box is changed, the first measurement antenna 30 will receive a significant difference in test result (for example, the emitting power). In other words, the first measurement antenna 30 will obtain unstable measurement results of wireless signal because the wireless electronic device under test 50 is placed at a different position or has a different size.

SUMMARY OF THE INVENTION

It is an object of the present invention to provide a test device for wireless electronic devices to promote the test stability and to decrease the difference in measurement signal caused by the difference in size or position of the electronic device under test.

The test device for the wireless electronic device of the present invention includes a metal casing, a radio frequency (RF)-absorbing material, a first measurement antenna, and an impedance adjustment module. The RF-absorbing material is disposed in the metal casing to enclose an inner space. The RF-absorbing material includes a clamping groove formed at one end of the RF-absorbing material. At least a part of the first measurement antenna disposed in the clamping groove. In a preferred embodiment, the first measurement antenna is in form of a sheet and has a first metal arm and a second metal arm connected to the impedance adjustment module and substantially extending along different positions of the inner surface of the RF-absorbing material. In addition, the RF-absorbing material includes a first absorbing layer and a second absorbing layer, and the first measurement antenna is disposed in the clamping groove between the first absorbing layer and the second absorbing layer.

The impedance adjustment module includes a dielectric layer, a microstrip line, and a slot line. The microstrip line and the slot line are disposed at opposite sides of the dielectric layer. The microstrip line and the slot line respectively include a first body and a second body, which are parallel to each other. The microstrip line includes a first adjustment portion extending from one end of the first body, and the slot line includes a second adjustment portion extending from one end of the second body. The projection of the first adjustment portion on the dielectric layer at least partially overlaps that of the second adjustment portion. Besides, the impedance adjustment module includes an impedance adjustment groove formed in the dielectric layer and adjacent to the second adjustment portion of the slot line.

BRIEF DESCRIPTION OF THE DRAWINGS

FIGS. 5A-5D are schematic views of the electromagnetic field generated in the inner space by the test device of FIG. 2;

FIGS. 7B-7D are schematic views of wireless signal feed-in loss in the inner space of the test device of the present invention.

DETAILED DESCRIPTION OF THE PREFERRED EMBODIMENT

Figure 1:
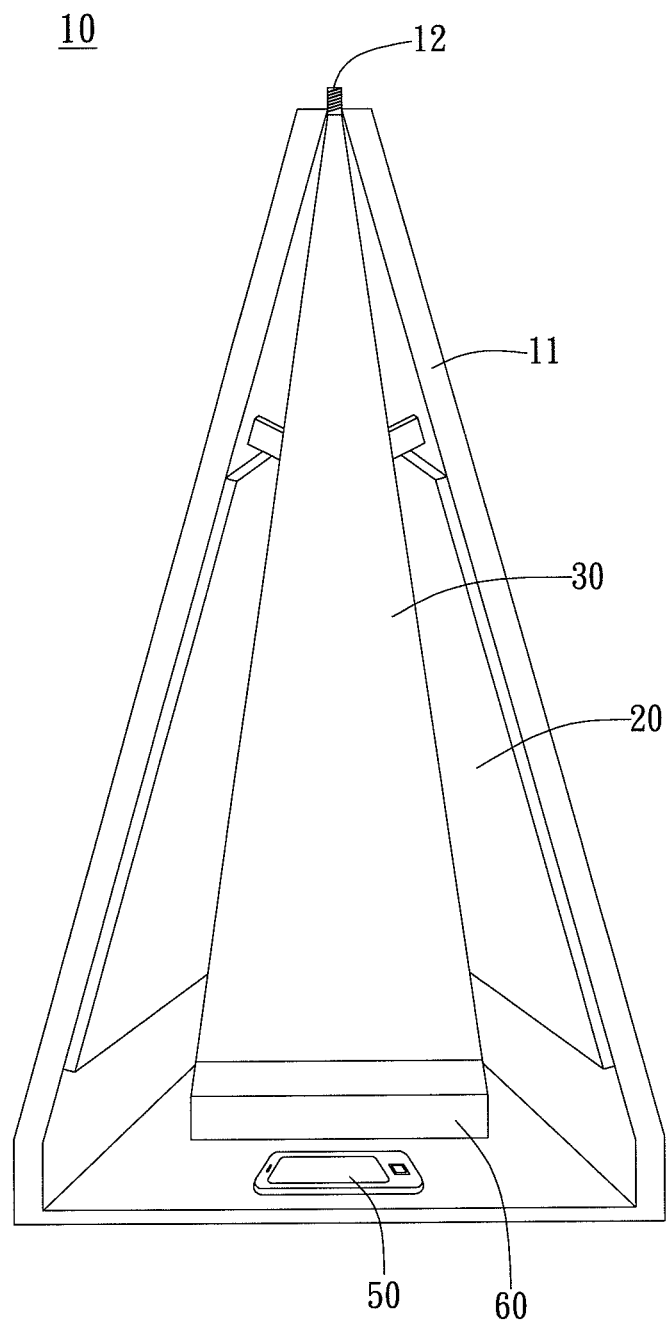
FIG. 1 is a schematic view of a traditional shielding box.
Figure 2:
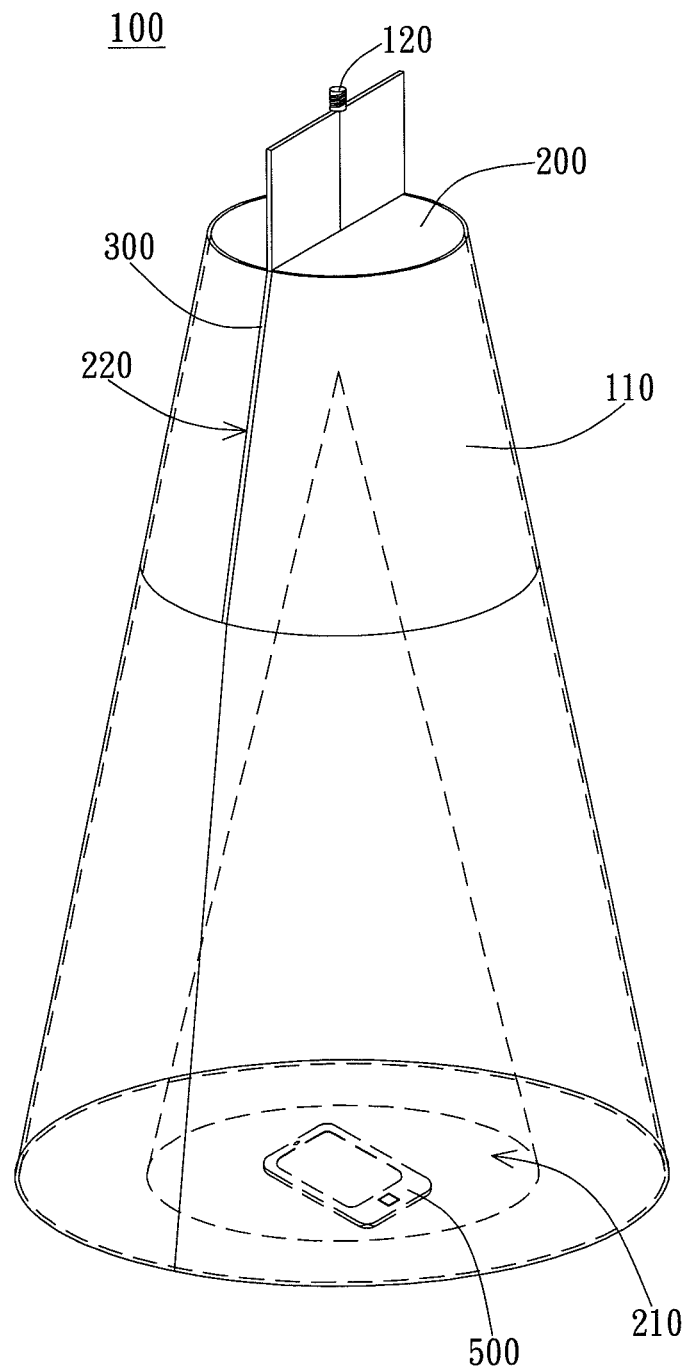
FIG. 2 is a schematic view of a test device of the present invention.
Figure 3:
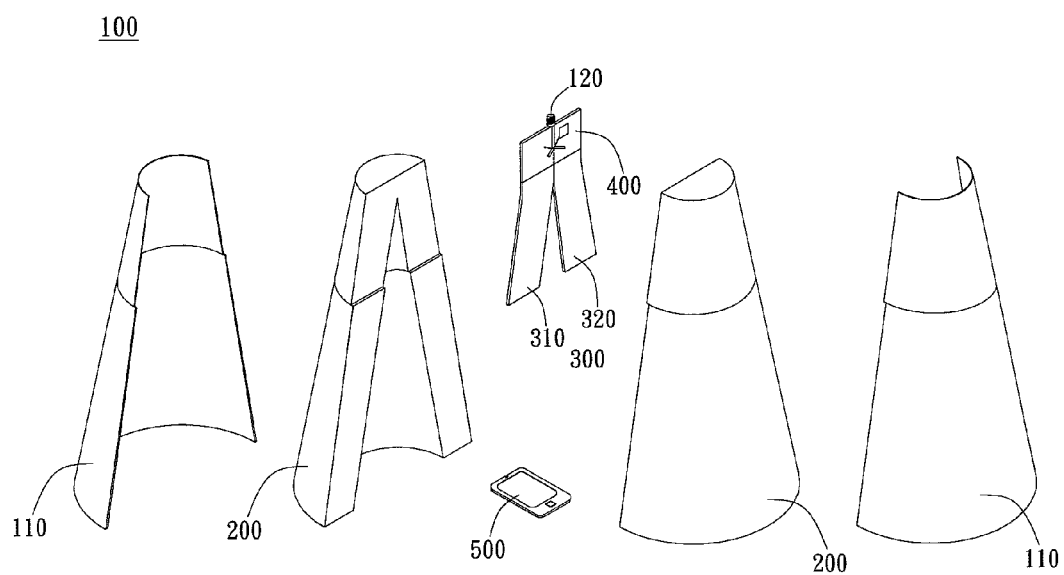
FIG. 3 is an exploded view of the test device of the present invention.

FIG. 2 and FIG. 3 are respectively a schematic view and an exploded view of a test device 100 of the present invention. In this embodiment, the test device 100 includes a metal casing 110, a signal feed-in portion 120, a RF-absorbing material 200, a first measurement antenna 300, and an impedance adjustment module 400, wherein an electronic device under test 500 is disposed in an inner space 210 enclosed by the RF-absorbing material 200.

As shown in FIG. 2, the metal casing 110 substantially covers the RF-absorbing material 200 and the electronic device under test 500 disposed in the RF-absorbing material 200 to isolate the electronic device under test 500 from other ambient emitting sources of wireless signals. As such, the metal casing 110 can ensure that the ambient wireless signals will not be received by the first measurement antenna 300 and the ambient wireless signals will not be regarded as the wireless signal transmitted from the electronic device under test 500, such as mobile phones and the like. In another aspect, the metal casing 110 also confines the wireless signal produced by the wireless electronic device under test 500 in the inner space 210 of the RF-absorbing material 200 to ensure that the first measurement antenna 300 will only receive the wireless signal transmitted from the electronic device under test 500. Besides, the metal casing 110 is preferably connected to the ground to avoid the formation of an induction loop and guides the ambient wireless signal to the ground.

The RF-absorbing material 200 is utilized to absorb the wireless signal produced by the electronic device under test 500 and to avoid a plurality of wireless signals from forming a composite wireless signal with a larger power through reflections and refractions in the inner space 210. In other words, the RF-absorbing material may ensure the first measurement antenna 300 to correctly receive the single wireless signal that is directly transmitted from the electronic device under test 500 rather than the composite wireless signal formed through reflections and refractions. Besides, the RF-absorbing material 200 includes a clamping groove 220 formed at one end of the RF-absorbing material 200 to accommodate the first measurement antenna 300. In this embodiment, the clamping groove 220 is preferably divided into two slits corresponding to the size and the width of the first measurement antenna 300 in two corresponding RF-absorbing materials 200, i.e. a first absorbing layer and a second absorbing layer, but not limited thereto. In other embodiments, the clamping groove 220 may be a slit cut from a single RF-absorbing material. Besides, the first measurement antenna 300 of this embodiment is in form of a sheet and has a first metal arm 310 and a second metal arm 320 extending toward different directions. The first metal arm 310 and the second metal arm 320 are attached onto the inner surface of the RF-absorbing material 200 corresponding to the clamping groove 220, but not limited thereto. The first measurement antenna 300 may have other amounts of metal arms or other suitable shapes for disposing in the clamping groove 220.

In the embodiment shown in FIG. 2 and FIG. 3, the metal casing 110 is substantially a conical casing for accommodating the RF-absorbing material 200, the first measurement antenna 300, and the electronic device under test 500. Besides, the RF-absorbing material 200 disposed in the metal casing 110 is also in form of a cone. The inner space 210 enclosed by the RF-absorbing material 200 is provided for accommodating the electronic device under test 500. However, in different embodiments, the metal casing 110, the RF-absorbing material 200, and the inner space 210 of the RF-absorbing material 200 may be in form of rectangle, square, or other shapes based on the size and shape of the electronic device under test 500.

The first measurement antenna 300 of this embodiment is preferably disposed in one end of the RF-absorbing material 200 and the inner space 210. The first measurement antenna 300 receives high frequency wireless signals from a back-end internet tester or a spectrum analyzer through the impedance adjustment module 400 and the signal feed-in portion 120 and then produces, based on the wireless signal, an electromagnetic field having evenly distributed magnitude in the inner space 210. Because the first measurement antenna 300 corresponds to the RF-absorbing material 200 and the axis of inner space 210, the aforementioned design and structure may ensure the first measurement antenna 300 producing the evenly distributed electromagnetic field in the inner space 210. The electromagnetic field produced by the first measurement antenna 300 is preferably distributed evenly outward with respect to an axis that is perpendicular to the bottom plane of the inner space 210 and passes through the center of the inner space 210. As such, the first measurement antenna 300 may utilize the evenly distributed electromagnetic field to compensate the signal variation caused by the difference in size or position of the electronic device under test 500. Therefore, even if the electronic device under test 500 is disposed at different position in the inner space 210, the power or frequency of the wireless signals received by the first measurement antenna 300 will have no significant difference.

After receiving the wireless signal, the first measurement antenna 300 will transmit the wireless signal to the back-end internet tester. The back-end internet tester will analyze characteristics (for example, frequency and power) of the wireless signal for the test personnel to evaluate the performance of the wireless transmission of the electronic device under test 500. Therefore, to ensure the integrity of signal received by the internet tester, the test device 100 of this embodiment utilizes the impedance adjustment module 400 to achieve an impedance matching between the measurement antenna and the internet tester. As such, after the impedance matching is achieved, the test device 100 may transmit the wireless signal to the back-end internet tester with the lowest loss of transmission energy.

Figure 4A:
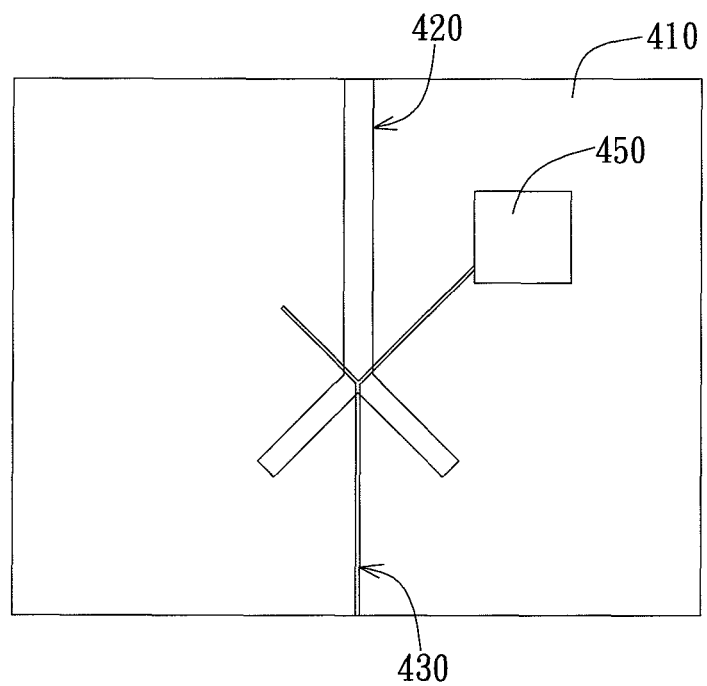
FIG. 4A is a schematic view of an impedance adjustment module of FIG. 2.
Figure 4B:
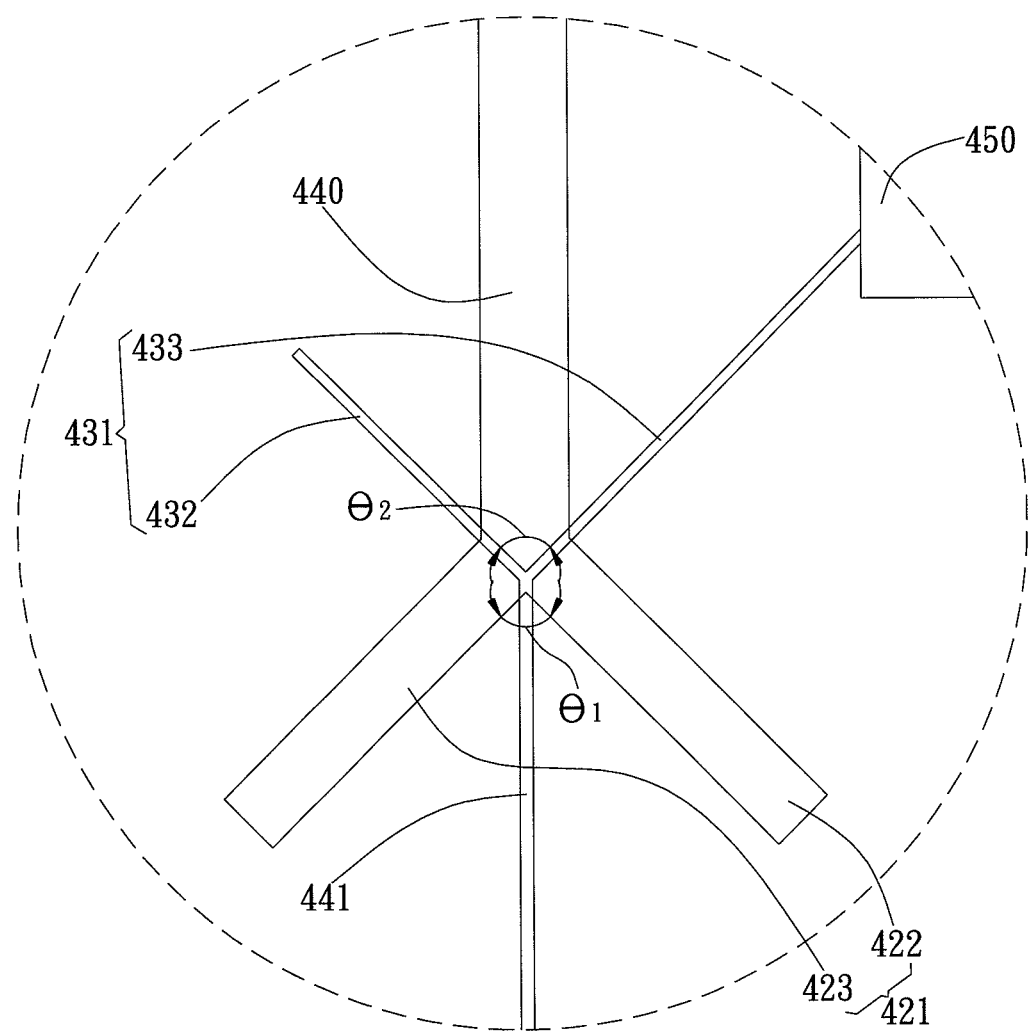
FIG. 4B is an enlarged schematic view of the impedance adjustment module of FIG. 4A.

FIG. 4A is a schematic view of an impedance adjustment module of FIG. 2. FIG. 4B is an enlarged schematic view of the impedance adjustment module of FIG. 4A. In the embodiment shown in FIG. 4A and FIG. 4B, the impedance adjustment module 400 includes a dielectric layer 410, a microstrip line 420, and a slot line 430.

In the embodiment shown in FIG. 4A and FIG. 4B, the microstrip line 420 and the slot line 430 are disposed at two opposite sides of the dielectric layer 410, respectively. The microstrip line 420 and the slot line 430 respectively include a first body 440 and a second body 441, which are substantially parallel to each other.

As shown in FIG. 4A and FIG. 4B, the microstrip line 420 includes a first adjustment portion 421 extending from one end of the first body 440. The slot line 430 includes a second adjustment portion 431 extending from one end of the second body 441. In this embodiment, the first adjustment portion 421 and the second adjustment portion 431 are utilized to adjust the impedance of the test device 100 to decrease the loss of the wireless signal transmitted to the back-end internet tester. Besides, the projection of the first adjustment portion 421 on the dielectric layer 410 at least partially overlaps the projection of the second adjustment portion 431 on the dielectric layer 410, as shown in FIGS. 4A and 4B. The first adjustment portion 421 is preferably electrically connected to the second adjustment portion 431 through a via (not shown) formed at an end portion of a first adjustment arm 422. Besides, the first adjustment portion 421 extends from one end of the first body 440 and the second adjustment portion 431 extends from one end of the second body 441, but not limited thereto. In different embodiments, the adjustment portion 421/431 may extend from other part of the body 440/441 according to the requirement of the impedance matching.

As shown in FIG. 4A and FIG. 4B, the first adjustment portion 421 includes the first adjustment arm 422 and a second adjustment arm 423. The second adjustment portion 431 includes a third adjustment arm 432 and a fourth adjustment arm 433. The first adjustment arm 422 connects the second adjustment arm 423 at a first angle $\theta_1$, and the third adjustment arm 432 connects the fourth adjustment arm 433 at a second angle $\theta_2$. Therefore, the microstrip line 420 or the slot line 430 substantially has a Y shape. Besides, in the embodiment shown in the FIG. 4A and FIG. 4B, the first angle $\theta_1$ is substantially equal to the second angle $\theta_2$, but not limited thereto. In different embodiments, the first angle $\theta_1$ and the second angle $\theta_2$ may be adjusted based on the requirements of the impedance matching. Besides, the first adjustment portion 421 and the second adjustment portion 431 shown in the FIGS. 4A and 4B respectively have two adjustment arms, but not limited thereto. In different embodiments, the first adjustment portion 421 and the second adjustment portion 431 may have adjustment arms in other amounts, length, and extending directions.

Besides, the impedance adjustment module 400 shown in FIG. 4A and FIG. 4B further includes an impedance adjustment groove 450 formed in the dielectric layer 410 and adjacent to the fourth adjustment arm 433 of the second adjustment portion 431. In this embodiment, the impedance adjustment groove 450 is substantially a square hole with 12 mm side and is connected to the fourth adjustment arm 433 to adjust the impedance matching between the test device 100 and the back-end internet tester. However, in different embodiments, the impedance adjustment groove 450 may have other shapes (for example, ellipse or circle) or sizes based on the characteristics of the first measurement antenna 300, the microstrip line 420, the slot line 430, and the dielectric layer 410.

Figure 5B:
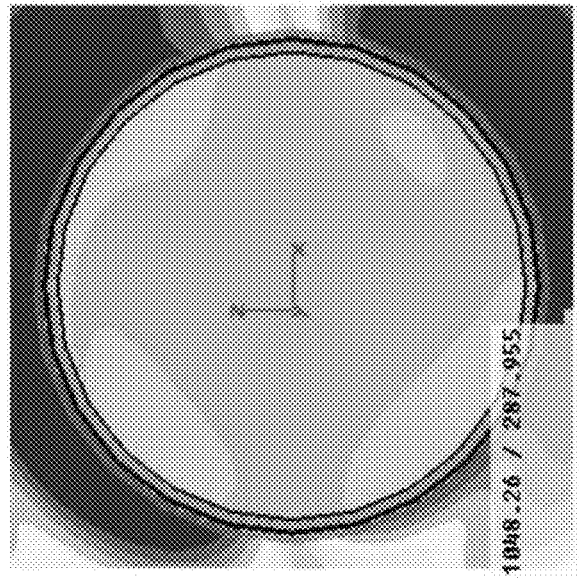
Figure 5C:
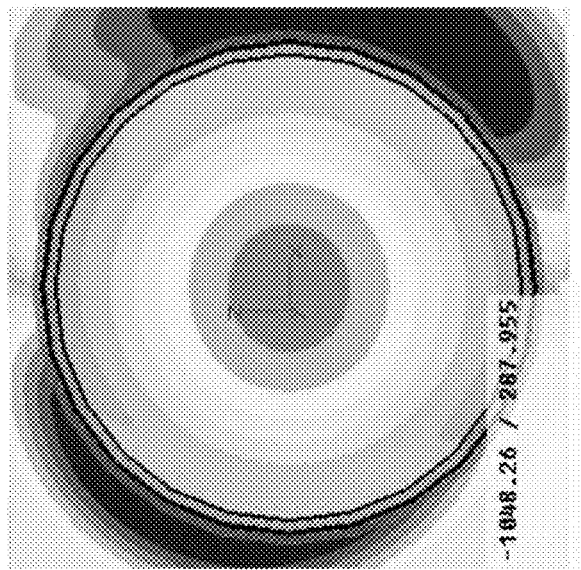

FIGS. 5A-5D are schematic views of the electromagnetic field generated by the test device 100 in the inner space 210 of FIG. 2. FIG. 5A illustrates the Co-polarized E-field generated by the measurement antenna after receiving a 1 GHz signal. FIG. 5B illustrates the Cross-Polarized E-field generated by the measurement antenna after receiving a 1 GHz signal. FIG. 5C illustrates the Co-polarized H-field generated by the measurement antenna after receiving a 1 GHz signal. FIG. 5D illustrates the Cross-Polarized H-field generated by the measurement antenna after receiving a 1 GHz signal.

As shown in FIGS. 5A-5D, the magnitude distribution of electric field and magnetic field generated by the first measurement antenna 300 in the inner space 210 are relatively uniform. The electric field and the magnetic field are substantially distributed outward in form of a circle with respect to an axis of the inner space 210, which serves as a center, so that the electric field and the magnetic field form a plurality of circular areas of different diameter and different magnitude in the inner space 210. In this embodiment, the electronic device under test 500 is preferably disposed at the center of the bottom surface of the inner space 210 for performance measurement. In other words, the electronic device under test 500 is preferably disposed at center the bottom surface of the inner space 210 where the magnitude of electromagnetic field is equivalent to receive the wireless signal generated by the measurement antenna and transmit the wireless signal from the center to the measurement antenna, but not limited thereto. Because each circular area is distributed evenly with respect to the same axis, the measurement deviation will not occur no matter whether the electronic device under test 500 has different size or is disposed at different position of the inner space 210.

As mentioned above, the present invention utilizes the first measurement antenna 300 that is disposed above the inner space 210 and along the axis thereof, so that the electromagnetic field is distributed outward evenly with respect to the axis of the inner space 210. As such, the first measurement antenna 300 of the present invention may transmit wireless signals having stable strength to the electronic device under test 500. Besides, the measurement antenna may also receive a wireless signal having stable strength from the electronic device under test 500. Therefore, the test device 100 of the present invention may receive a stable wireless signal by means of an evenly distributed magnitude of electromagnetic field no matter whether the electronic device under test 500 has different size or is disposed at different position of the inner space 210.

Figure 6A:
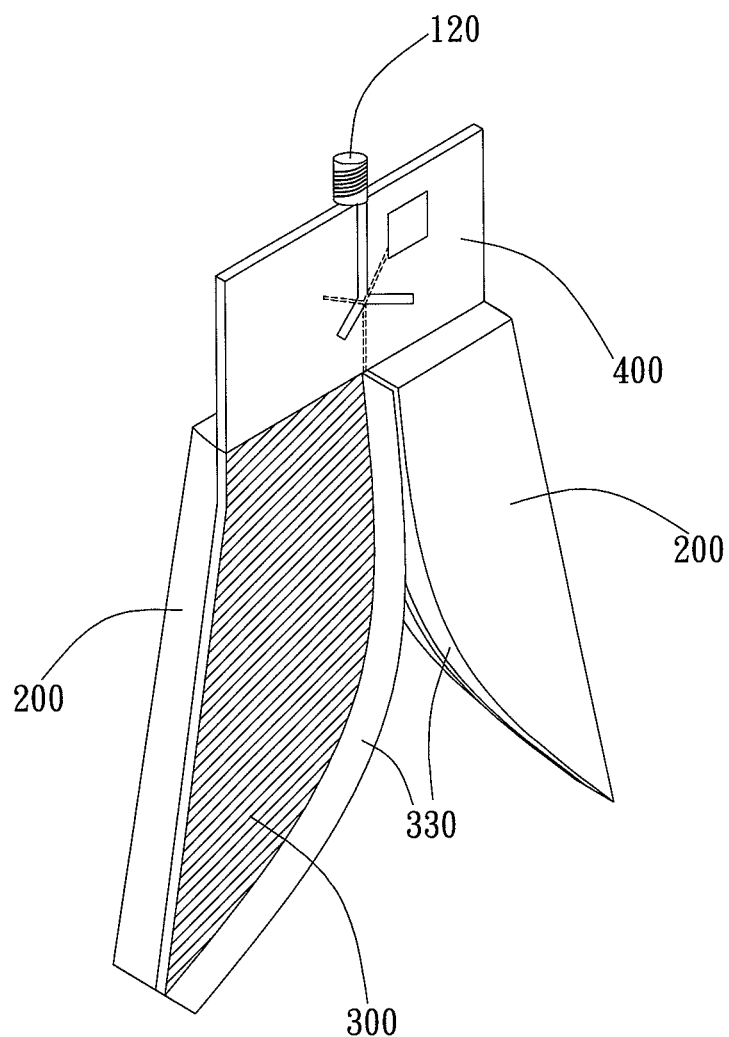
FIG. 6A is an assembly view of another embodiment including a first measurement antenna, a second measurement antenna, and an impedance adjustment module of the present invention.
Figure 6B:
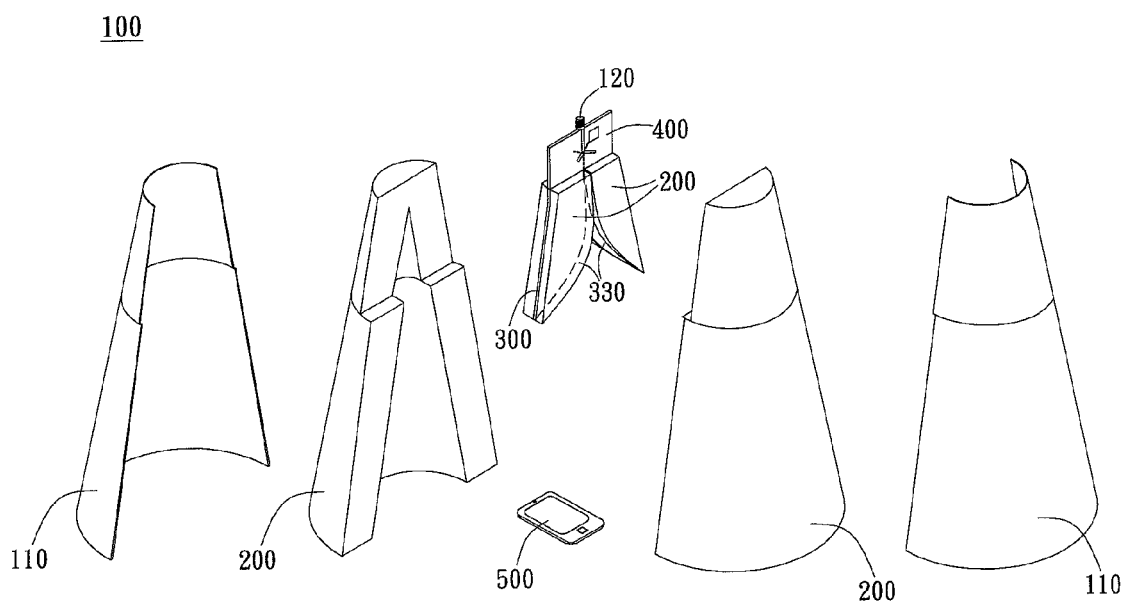
FIG. 6B is an exploded view of another embodiment of the test device of the present invention.

FIG. 6A and FIG. 6B illustrate another embodiment of the test device 100 of the present invention. In the embodiment of FIG. 6A and FIG. 6B, the test device 100 further includes a second measurement antenna 330 electrically connected to the first measurement antenna 300 and produces an even electromagnetic field in the inner space 210 based on the signal transmitted from the impedance adjustment module 400. Besides, the second measurement antenna 330 may further increase the bandwidth of the magnitude of the electromagnetic field in the inner space 210 to facilitate the measurement of performance of the wireless transmission between the antenna 300/330 and the electronic device under test 500.

As shown in FIG. 6A, one end of the first measurement antenna 300 is electrically connected to a surface of the second measurement antenna 330. Besides, the RF-absorbing material 200 is disposed in the space between the surface of the first measurement antenna 300 and the surface of the second measurement antenna 330 to further absorb the wireless signal produced by the electronic device under test 500 or the measurement antenna 300/330 in the inner space 210. As such, the RF-absorbing material 200 may prevent a plurality of wireless signals from forming a composite wireless signal having a larger power through reflections and refractions to affect the test results. In addition, the RF-absorbing material 200 disposed between the surface of the first measurement antenna 300 and the surface of the second measurement antenna 330 may also enhance the structural strength of the measurement antenna 300/330 to be steadily disposed in the RF-absorbing material 200 as shown in FIG. 6B.

In the embodiment shown in FIG. 6A and FIG. 6B, the first measurement antenna 300 and the second measurement antenna 330 are substantially perpendicular to each other, wherein the first measurement antenna 300 is connected to the second measurement antenna 330 in a manner of standing upright on the surface of the second measurement antenna 330. As such, the second measurement antenna 330 receives the signal produced by the back-end internet tester (not shown) through the first measurement antenna 300 and the impedance adjustment module 400, or transmits the wireless signal through the first measurement antenna 300 and the impedance adjustment module 400 to the back-end internet tester in a wired manner.

Figure 7A:
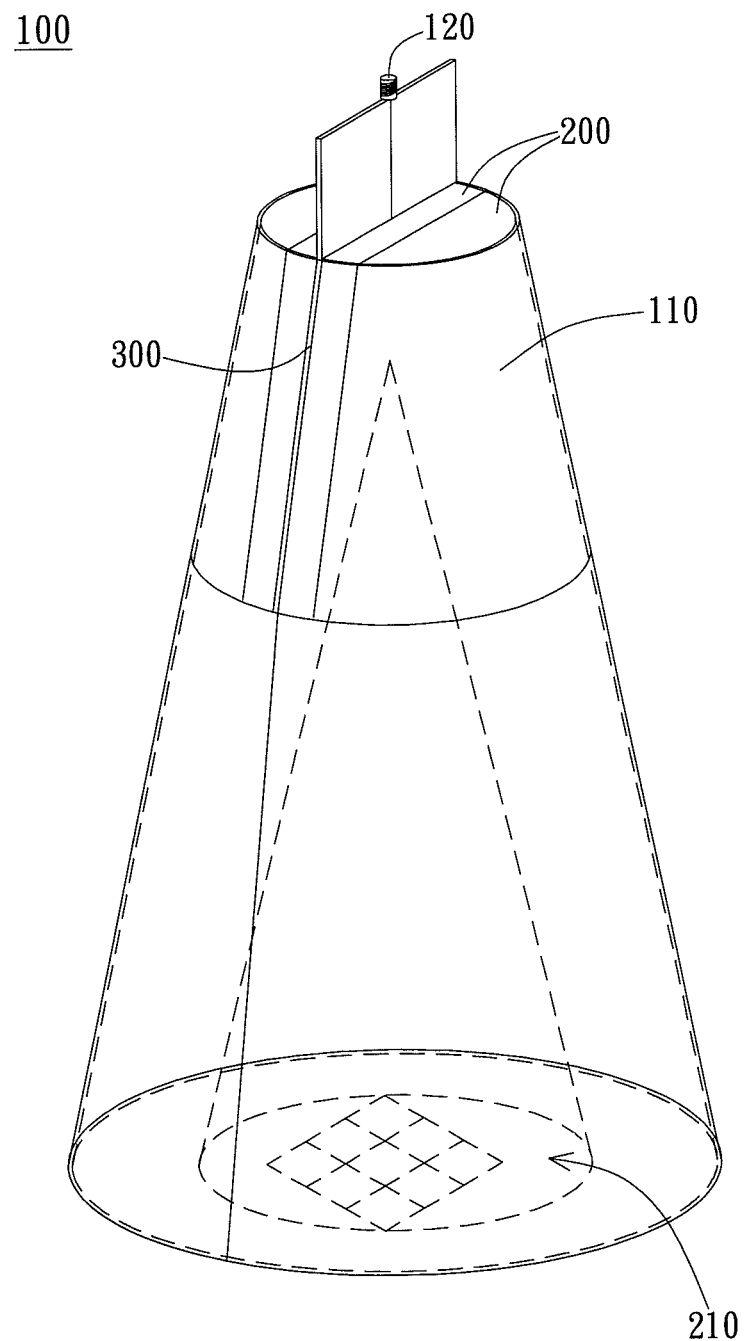
FIG. 7A is a schematic view of another embodiment of the test device of the present invention.

FIG. 7A is a schematic view of another embodiment of the test device 100 of the present invention. As shown in FIG. 7A, the test device 100 includes a metal casing 110, a signal feed-in portion 120, a RF-absorbing material 200, a first measurement antenna 300, a second measurement antenna 330 (please refer to FIG. 6), and an impedance adjustment module 400. The electronic device under test 500 is disposed in the inner space 210 enclosed by the RF-absorbing material 200. The structure and operation principle of the test device 100 in this embodiment is substantially the same as those shown in FIG. 2 and will not elaborate hereinafter.

As shown in FIG. 7A, the inner space 210 of this embodiment defines a measuring area of the magnitude of electromagnetic field to measure the wireless signal feed-in loss between the measurement antenna 300/330 and the electronic device under test 500 under operations at different frequency. The aforementioned measuring area may be further divided into nine measuring blocks. The signal feed-in loss measured at each measuring block will be recorded and shown in FIGS. 7B-7D. Besides, in the embodiment of FIG. 7A, each measuring block is substantially a square in 53 mm×53 mm, but not limited thereto. In different embodiments, these measuring blocks may be other shapes or sizes.

FIGS. 7B-7D are schematic views of wireless signal feed-in loss of the measurement antenna 300/330 and the electronic device under test 500 in the inner space 210 and the unit of wireless signal feed-in loss is dB. FIG. 7B illustrates the wireless signal feed-in loss of 900 MHz wireless signal transmitted from the measurement antenna 300/330 to the electronic device under test 500. FIG. 7C illustrates the wireless signal feed-in loss of 1800 MHz wireless signal transmitted from the measurement antenna 300/330 to the electronic device under test 500. FIG. 7D illustrates the wireless signal feed-in loss of 2450 MHz wireless signal transmitted from the measurement antenna 300/330 to the electronic device under test 500.

As shown in FIGS. 7B-7D, in each wireless signal frequency, the feed-in losses between the measurement antenna 300/330 and the wireless device under test 500 in different areas and at different transmission frequencies are relatively consistent. In other words, the feed-in losses in each measuring area are substantially the same. Accordingly, when the first measurement antenna 300 and the second measurement antenna 330 disposed above the center of the inner space 210 and the axis transmitting wireless signals with different frequencies may also keep the feed-in signal loss at different areas of the inner space 210 substantially consistent. As such, the test device 100 of the present invention may produce wireless signals with stable signal magnitude and transmit the wireless signals to the electronic device under test 500 through the measurement antenna 300. Therefore, the test device 100 may obtain stable measuring results of the wireless signal by means of the evenly distributed magnitude of electromagnetic field even though the electronic device under test 500 has different size or is disposed at different location of the inner space 210.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A test device for a wireless electronic device, comprising:
    a metal casing;
    a RF-absorbing material disposed in the metal casing to enclose an inner space, wherein the RF-absorbing material includes a clamping groove formed at one end of the RF-absorbing material;
    a first measurement antenna disposed in the clamping groove and located at one end of the inner space; and
    an impedance adjustment module electrically connected to the first measurement antenna for receiving a signal transmitted from the first measurement antenna or transmitting an electrical signal to the first measurement antenna, wherein the impedance adjustment module comprises:
        a dielectric layer;
        a microstrip line disposed at one side of the dielectric layer and comprising a first body; and
        a slot line disposed at the other side of the dielectric layer opposite to the microstrip line, the slot line electrically connected to the first measurement antenna and comprising a second body, wherein the first body and the second body are substantially parallel to each other.

2. The test device of claim 1, wherein the microstrip line comprises a first adjustment portion extending from one end of the first body, the slot line comprises a second adjustment portion extending from one end of the second body, the projection of the first adjustment portion on the dielectric layer at least partially overlaps that of the second adjustment portion.

3. The test device of claim 2, wherein the impedance adjustment module further comprises an impedance adjustment groove formed in the dielectric layer and adjacent to the second adjustment portion.

4. The test device of claim 2, wherein the first adjustment portion comprises a first adjustment arm and a second adjustment arm, the second adjustment portion comprises a third adjustment arm and a fourth adjustment arm, the projection of the first adjustment arm on the dielectric layer at least partially overlaps that of the fourth adjustment arm, the projection of the second adjustment arm on the dielectric layer at least partially overlaps that of the third adjustment arm.

5. The test device of claim 4, wherein the impedance adjustment module further comprises an impedance adjustment groove formed in the dielectric layer and adjacent to the fourth adjustment arm of the slot line.

6. The test device of claim 4, wherein the first adjustment arm and the second adjustment arm extend from one end of the microstrip line and include a first angle, the third adjustment arm and the fourth adjustment arm extend from one end of the slot line and include a second angle, the first angle is substantially equal to the second angle.

7. The test device of claim 4, wherein the first adjustment arm and the third adjustment arm are substantially parallel to each other in an extending direction thereof, the second adjustment arm and the fourth adjustment arm are substantially parallel to each other in an extending direction thereof.

8. The test device of claim 2, further comprising a signal feed-in portion electrically connected to one end of the microstrip line opposite to the first adjustment portion.

9. The test device of claim 1, wherein the first measurement antenna is in form of a sheet and has a first metal arm and a second metal arm connected to the impedance adjustment module and substantially extending along different positions of an inner surface of the RF-absorbing material, the inner space is located between the first metal arm and the second metal arm.

10. The test device of claim 9, wherein the RF-absorbing material comprises a first absorbing layer and a second absorbing layer, the clamping groove is formed between the first absorbing layer and the second absorbing layer.

11. The test device of claim 1, wherein the impedance adjustment module receives a first signal from outside and transmits a second signal to the first measurement antenna according to the first signal, the first measurement antenna produces an electromagnetic field in the inner space according to the second signal, wherein the magnitude of the electromagnetic field is distributed evenly outward with respect to an axis that passes through the center of the inner space and is perpendicular to a plane of the inner space.

12. The test device of claim 1, wherein the metal casing and the RF-absorbing material are substantially a conical casing.

13. The test device of claim 1, wherein the inner space is substantially a cone.

* * * * *